（12) United States Patent
McMillan et al.

(10) Patent No.: US 7,992,030 B2
(45) Date of Patent: Aug. 2, 2011

(54) FALL TIME ACCELERATOR CIRCUIT

(75) Inventors: Henry G. McMillan, Raleigh, NC (US); Pravin Patel, Cary, NC (US); Challis L. Purrington, Raleigh, NC (US); Gwendolyn R. Tobin, Jacksonville, FL (US); Christopher C. West, Raleigh, NC (US); Ivan R. Zapata, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 1058 days.

(21) Appl. No.: 11/746,102

(22) Filed: May 9, 2007

(65) Prior Publication Data

US 2008/0278207 A1   Nov. 13, 2008

(51) Int. Cl.
*G06F 1/00* (2006.01)
(52) U.S. Cl. .................... 713/500; 713/502; 375/238
(58) Field of Classification Search .................. 713/500, 713/502; 375/238
See application file for complete search history.

(56) References Cited

U.S. PATENT DOCUMENTS

| 4,498,021 | A | | 2/1985 | Uya | |
|---|---|---|---|---|---|
| 5,945,850 | A | * | 8/1999 | Segan et al. | 327/24 |
| 6,784,689 | B2 | | 8/2004 | Bobba et al. | |
| 6,911,874 | B2 | * | 6/2005 | Dvorak | 332/112 |
| 6,999,020 | B2 | * | 2/2006 | Mizumasa et al. | 341/162 |
| 7,610,416 | B2 | * | 10/2009 | Lum et al. | 710/62 |
| 2001/0024375 | A1 | * | 9/2001 | Kojima et al. | 363/41 |
| 2003/0071651 | A1 | * | 4/2003 | Vora | 326/38 |
| 2003/0146800 | A1 | * | 8/2003 | Dvorak | 332/112 |
| 2004/0043734 | A1 | * | 3/2004 | Hashidate | 455/141 |
| 2005/0162301 | A1 | * | 7/2005 | Mizumasa et al. | 341/162 |
| 2005/0240702 | A1 | * | 10/2005 | Kunkel et al. | 710/300 |
| 2006/0236003 | A1 | * | 10/2006 | Lum et al. | 710/62 |
| 2006/0280004 | A1 | * | 12/2006 | Washburn et al. | 365/189.09 |

OTHER PUBLICATIONS

McKinnon, J.D.; Active Circuit for Neutralizing Capacitive Loading; Technical Disclosure Bulletin 11-75, p. 1933-1934; Nov. 1975.

* cited by examiner

*Primary Examiner* — Thomas Lee
*Assistant Examiner* — Jaweed A Abbaszadeh
(74) *Attorney, Agent, or Firm* — Steven M. Greenberg, Esq.; Carey, Rodriquez, Greenberg & Paul

(57) ABSTRACT

Embodiments of the invention address deficiencies of the art in respect to digital signal transmissions and provide a novel and non-obvious fall time accelerator circuit for use in a USB interface. In one embodiment of the invention, the USB interface can include a USB port driver coupled to a host controller driver over a USB bus. The USB interface also can include a fall time accelerator circuit coupled to the USB bus between the USB port driver and the host controller driver. The fall time accelerator circuit can include a pulse signal generator coupled to an inbound signal path from the USB bus and arranged to generate a tunable pulse upon detecting a falling edge of a digital signal on the inbound signal path. The circuit further can include an active timer additionally coupled to the inbound signal path to hold the tunable pulse for a set period of time. Finally, the circuit can include a falling drive signal strengthener coupled to an outbound signal path from the pulse signal generator arranged to release the tunable pulse on the outbound signal path onto the USB bus.

13 Claims, 4 Drawing Sheets

FALL TIME ACCELERATOR CIRCUIT

BACKGROUND OF THE INVENTION

1. Field of the Invention

The present invention relates to the field of integrated circuits and more particularly to excessive capacitive loading remediation for integrated circuits and printed circuit board (PCB) structures.

2. Description of the Related Art

Among the most advanced integrated circuits (IC), microprocessors control everything from computers to cellular phones to the digital processing of microwaves. The various computational processes and programmatic operations performed by microprocessors are facilitated through the use of signals that provide electrical pathways for data to propagate between the various components of an IC. ICs have consistently migrated to smaller feature sizes over the years, allowing more circuitry to be packed on each chip.

Communication links between ICs typically have long, interconnected electrical wiring inherently exhibiting significant delays to rise and fall times based on the resistance and capacitance of the electrical wiring. All electrical wiring in ICs has some amount of resistance and some amount of capacitance, although it is generally minimized by designing ICs with the shortest possible routes and maximum isolation from other wiring. The edges of digital signals have exponentially rising and falling edges which, combined with this resistance and capacitance of the electrical wiring inside ICs and PCB traces, lead directly to significant propagation delays. This propagation delay slows the falling edge of a signal, consequently leading to an excessive fall time. This excessive transmission line bus capacitance, which causes propagation delay, can also lead to poor signal quality.

Excessive bus capacitance often arises in the context of driving a universal serial bus (USB) interface from the motherboard of a personal computer. Referring to FIG. 1A, a schematic illustration is provided of a computing system configured to support a conventional USB interface as known in the art. As shown in FIG. 1A, the host computing platform 110 can generally support USB devices 140 through a USB port driver 150 that couples to a host controller driver 120 over a USB bus 130. The signal shared between the host controller driver 120 and the USB port driver 150 can become susceptible to excessive bus capacitance due to its overall length.

Conventional options for combatting excessive bus capacitance include rise time accelerators that attempt to decrease the excessive bus capacitance in a transmission line. However, these rise time accelerators only affect the rising edge of a signal and not the falling edge of a signal. A second option to counteract excessive capacitance in medium speed devices is to implement shorter cable runs but that could place severe limits on the applications by restricting the length of the bus to an impractical length. A third option is to apply re-clocking or re-driving. As yet a fourth option, signal propagation delay time can be reduced by making line driving transistors large. However, the enlargement of transistors of individual output gates requires extremely large area and therefore an increased size in the chip. An unfavorable result of overall increase in power consumption can occur as a result.

One conventional solution to improve adverse effects on signal timings and propagation delays includes the placement of buffers in series along the wiring route. Specifically, an otherwise long wiring route can be broken into two parts, and two inverters forming buffers can be placed serially there between. However, the breaking of the electrical wiring route into two parts increases the overall delay of the signal. Moreover, since the wiring route is physically cut into two parts, a contact resistance is added to the circuit because of contacts with the cut portions. The USB Bus, however, is bidirectional such that this approach requires bidirectional buffers. This additional requirement increases complexity in the control circuit required to determine the direction of drive. These and other factors increase propagation delays even further.

BRIEF SUMMARY OF THE INVENTION

Embodiments of the invention address deficiencies of the art in respect to digital signal transmissions and provide a novel and non-obvious fall time accelerator circuit for use in a USB interface. In one embodiment of the invention, the USB interface can include a USB port driver coupled to a host controller driver over a USB bus. The USB interface also can include a fall time accelerator circuit coupled to the USB bus between the USB port driver and the host controller driver. The fall time accelerator circuit can include a pulse signal generator coupled to an inbound signal path from the USB bus and arranged to generate a tunable pulse upon detecting a falling edge of a digital signal on the inbound signal path. The circuit further can include an active timer additionally coupled to the inbound signal path to hold the tunable pulse for a set period of time. Finally, the circuit can include a falling drive signal strengthener coupled to an outbound signal path from the pulse signal generator arranged to release the tunable pulse on the outbound signal path onto the USB bus.

In one aspect of the embodiment, the inbound signal path can include an attenuator. In another aspect of the embodiment, a trigger can be arranged to detect the falling edge responsive to the digital signal crossing a pre-configured threshold. For example, the pre-configured threshold can be set between 0 and 3.3 Volts. In yet another aspect of the embodiment, a resistor-capacitor (RC) modulator can be coupled to the active timer and arranged to provide the tunable pulse. Finally, in even yet another aspect of the embodiment, the falling signal drive strengthener can include a NAND gate.

Additional aspects of the invention will be set forth in the description which follows, will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Embodiments of the invention provide a method and circuit for neutralizing capacitive loading. In accordance with an embodiment of the present invention, a fall time accelerator circuit supporting a USB bus interface can be provided. The fall time accelerator circuit can facilitate the discharge of bus capacitance in a USB bus interface more efficiently by detecting a falling edge of a digital signal, driving a low-going pulse on the USB bus, holding the pulse and finally releasing the pulse to avoid affecting the subsequent data bit. In this way, by using resistive coupling and pulse width tuning, better discharging of bus capacitance for bidirectional multi-driver applications can be achieved.

Figure 1A:
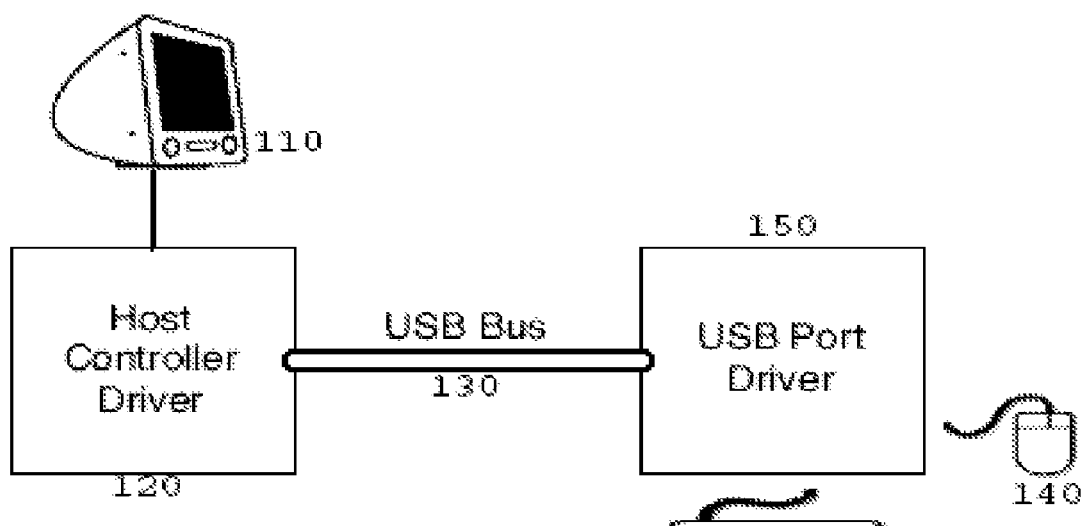
FIG. 1A is a schematic illustration of computing system configured to support a conventional USB interface as known in the art.
Figure 1B:
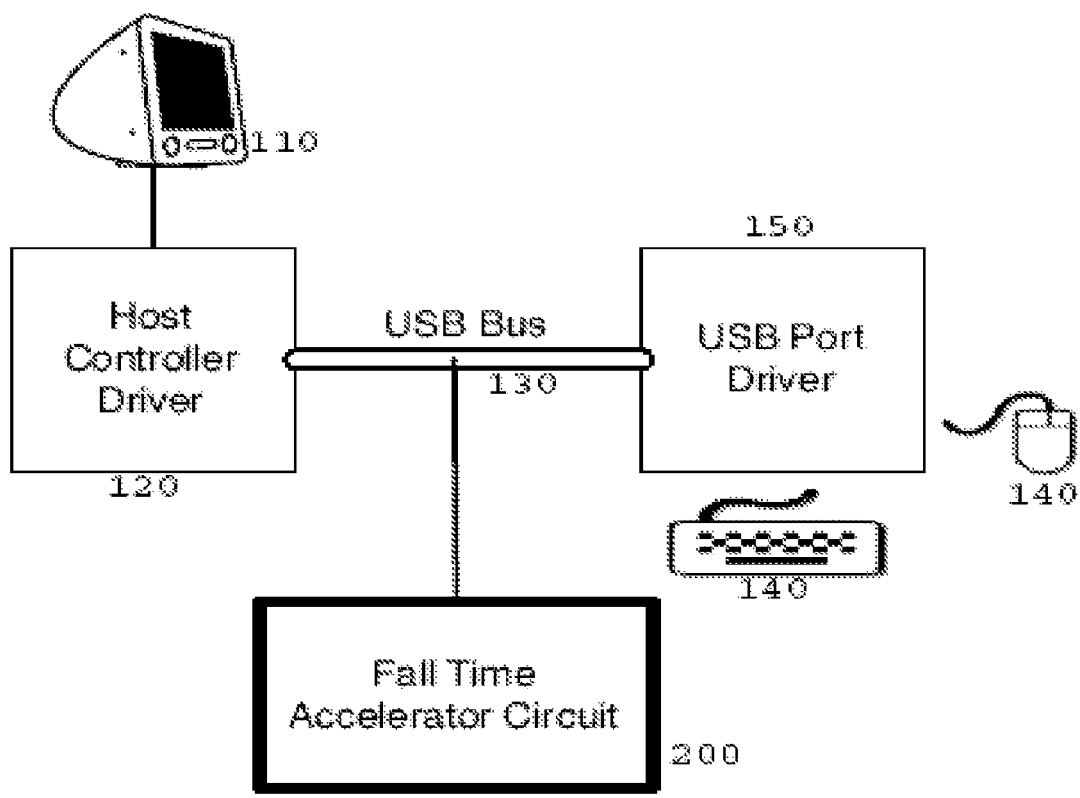
FIG. 1B is a schematic illustration of a computing system configured to support a USB interface integrated with the fall time accelerator circuit of the present invention.

In illustration, FIG. 1B depicts a computing system configured to support a USB interface integrated with the fall time accelerator circuit of the present invention. As shown in FIG. 1B, a host computing platform 110 can support a host controller driver 120 when coupling USB devices 140 through a USB port driver 150. The USB port driver 150, itself, can be coupled to the host controller driver 120 over a USB bus 130. To combat excess bus capacitance, however, a fall time accelerator circuit 200 can be coupled to the USB bus 130 in order to accelerate the fall times of the trailing edge of signals on the USB bus 130. This in turn minimizes the effects of the excess bus capacitance.

Figure 2A:
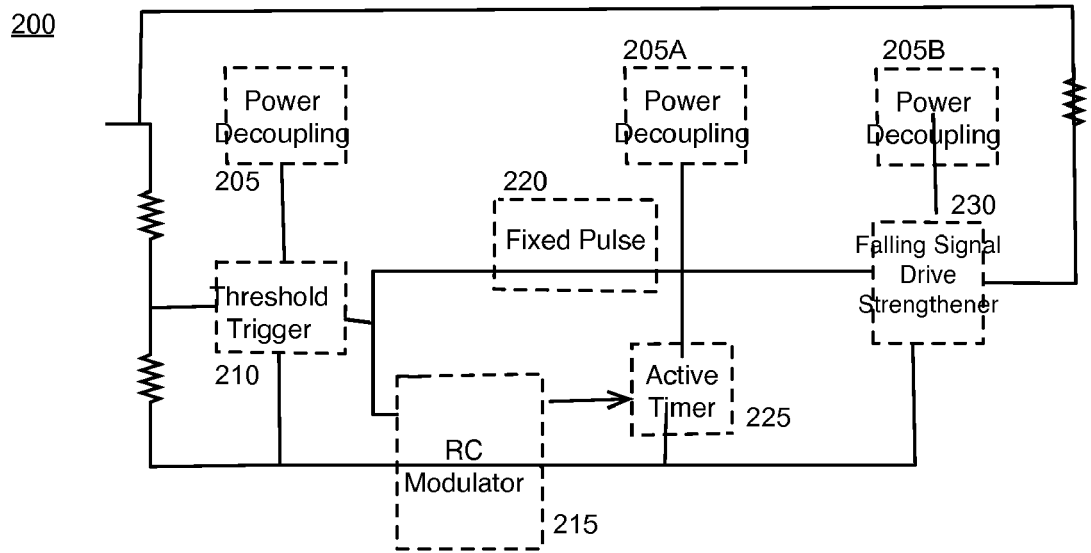
FIG. 2A illustrates a summary schematic diagram of the fall time accelerator integrated circuit of FIG. 1B.

In more particular illustration, FIG. 2A is a summary schematic diagram of the fall time accelerator integrated circuit of FIG. 1B. As shown in FIG. 2A, a fall time accelerator circuit 200 can be coupled to a USB bus and can include a power decoupling functional blocks 205, 205a, and 205b; a threshold trigger functional block 210; an RC modulator functional block 215; a fixed pulse functional block 220; an active timer functional block 225; and a falling signal drive strengthener functional block 230. The power decoupling functional blocks 205, 205a, and 205b; as is well known in the art, can capacitively decouple the frequency components of the power signal applied to the fall time accelerator circuit 200.

An inbound data signal can be split between the threshold trigger functional block 210 and the RC modulator functional block 215. Whereas the RC modulator functional block 215 can filter an inbound signal pulse in order to tune a pulse width suitable for processed signal pulse widths of different data rates, the threshold trigger functional block 210, once enabled upon detecting a falling edge of the signal pulse, can activate the fixed pulse functional block 220. The fixed pulse functional block 220 in turn can be configured to generate an optimal fixed pulse with a speedy fall time for the trailing edge of the fixed pulse. Finally, the active timer functional block 225 can deactivate the fall time accelerator circuit 200 in order to avoid race conditions and to eliminate any effects on the rising edge of the signal.

Figure 2B:
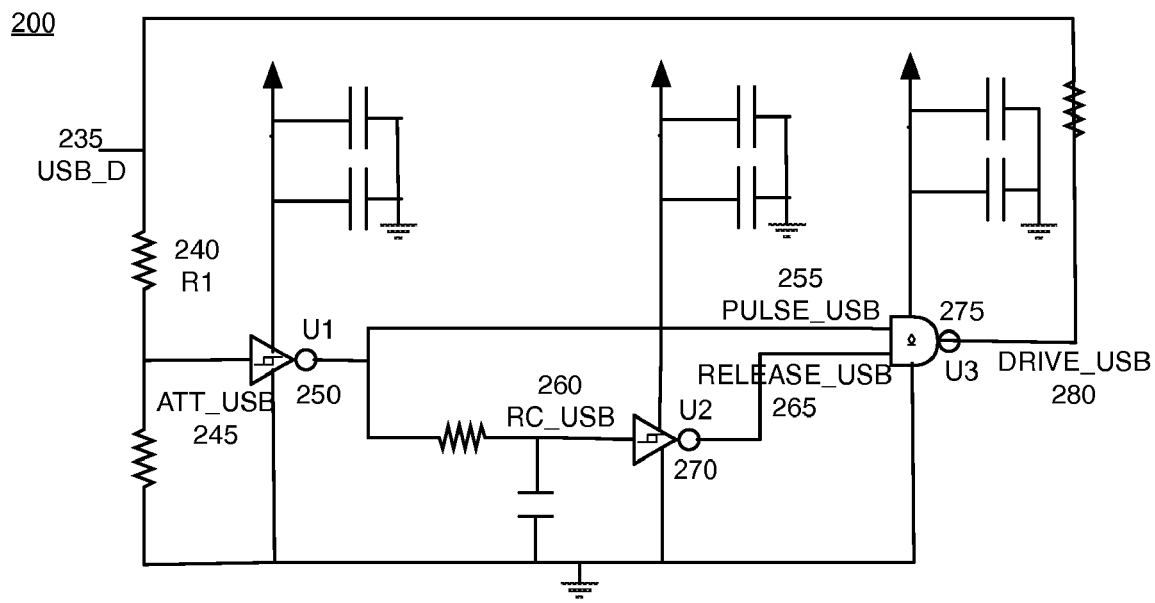
FIG. 2B illustrates a detailed schematic diagram of the fall time accelerator integrated circuit of FIG. 1B.

The falling signal drive strengthener functional block 230 can combine the signal pulse of the RC modulator functional block 215 and the fixed pulse functional block 220 into an optimized signal pulse with a speedy fall time. The resulting optimized signal pulse can be placed onto the USB based for delivery to the host controller. In more specific illustration, FIG. 2B illustrates a detailed schematic diagram of the fall time accelerator integrated circuit of FIG. 1B. As shown in FIG. 2B, the fall time accelerator circuit 200 can attenuate digital signal USB_D 235 from USB data port through resistor R1 240 to match a threshold voltage that triggers recognition of a falling edge by lessening the power of USB_D 235 into ATT_USB 245.

The fall time accelerator circuit 200 can be activated when the attenuated signal on ATT_USB 245 matches a specified threshold value indicating the detection of a falling edge. If the attenuated signal on ATT_USB 245 has a value that matches or falls below the threshold value, then the attenuated signal is inverted by inverter U1 250, and the fall time accelerator circuit 200 becomes activated. For example, a given range for the threshold can include 1.5 Volts. In this example, when low logic on ATT_USB 245 passes through inverter U1 250 having a value that is less than 1.5 V, the inverter output becomes high logic which activates the fall time accelerator circuit 200.

Once the fall time accelerator circuit 200 becomes activated, a fixed pulse PULSE_USB 255 can be generated to control a field effect transistor or open-drain device that bleeds energy from the signal flow. The lower portion of the fall time accelerator circuit 200, by comparison, can use an RC modulator to tune the pulse width for different data rates with a simple resistor value change resulting in RC_USB 260. Thereafter, RC_USB 260 combined with inverter U2 270 can create an active timer by inverting the output RELEASE_ USB 265 to eventually deactivate the circuit. In this regard, RELEASE_USB 265 lags slightly behind PULSE_USB 255 to set a phase relationship and can be held low for a period of time specified by the active timer.

After setting an active timer, RC_USB 260 can be inverted by inverter U2 270 in order to dis-arm the fall time accelerator circuit 200. Dis-arming can ensure that the fall time accelerator circuit 200 becomes deactivated before the USB driver/ receiver drives the signal back to high. In this regard, the driver/receiver should eventually drive the signal to a high state in order to allow the fall time accelerator circuit to re-arm for the next falling edge of the signal. Finally, NAND gate U3 275 can take in the low logic RELEASE_USB 265 after RELEASE_USB 265 becomes inverted by inverter U2 270 and the pulse DRIVE_USB 280 will be high logic; and in the case of an open-drain output driver on NAND gate U3 275; high-impedance and consequently have no further effect on the bus until the next time the circuit is activated.

Thus, the fall time accelerator circuit 200 will have been dis-armed and the pulse DRIVE_USB 280 is released, also releasing the USB bus back to the USB driver/receiver. To faciliate an understanding of the logical operation of the fall time accelerator circuit 200, the following truth table can be constructed:

| | USB_D | ATT_USB | PULSE_USB | RC_USB | RELEASE_USB | DRIVE_USB |
|---|---|---|---|---|---|---|
| Falling Edge ARM | 0 | 0 | 1 | 0 | 1 | 0 |

-continued

| | USB_D | ATT_USB | PULSE_USB | RC_USB | RELEASE_USB | DRIVE_USB |
|---|---|---|---|---|---|---|
| Falling Edge Release | 0 | 0 | 1 | 1 | 0 | 1 |
| Rising Edge | 1 | 1 | 0 | 0 | 1 | 1 |

Figure 3:
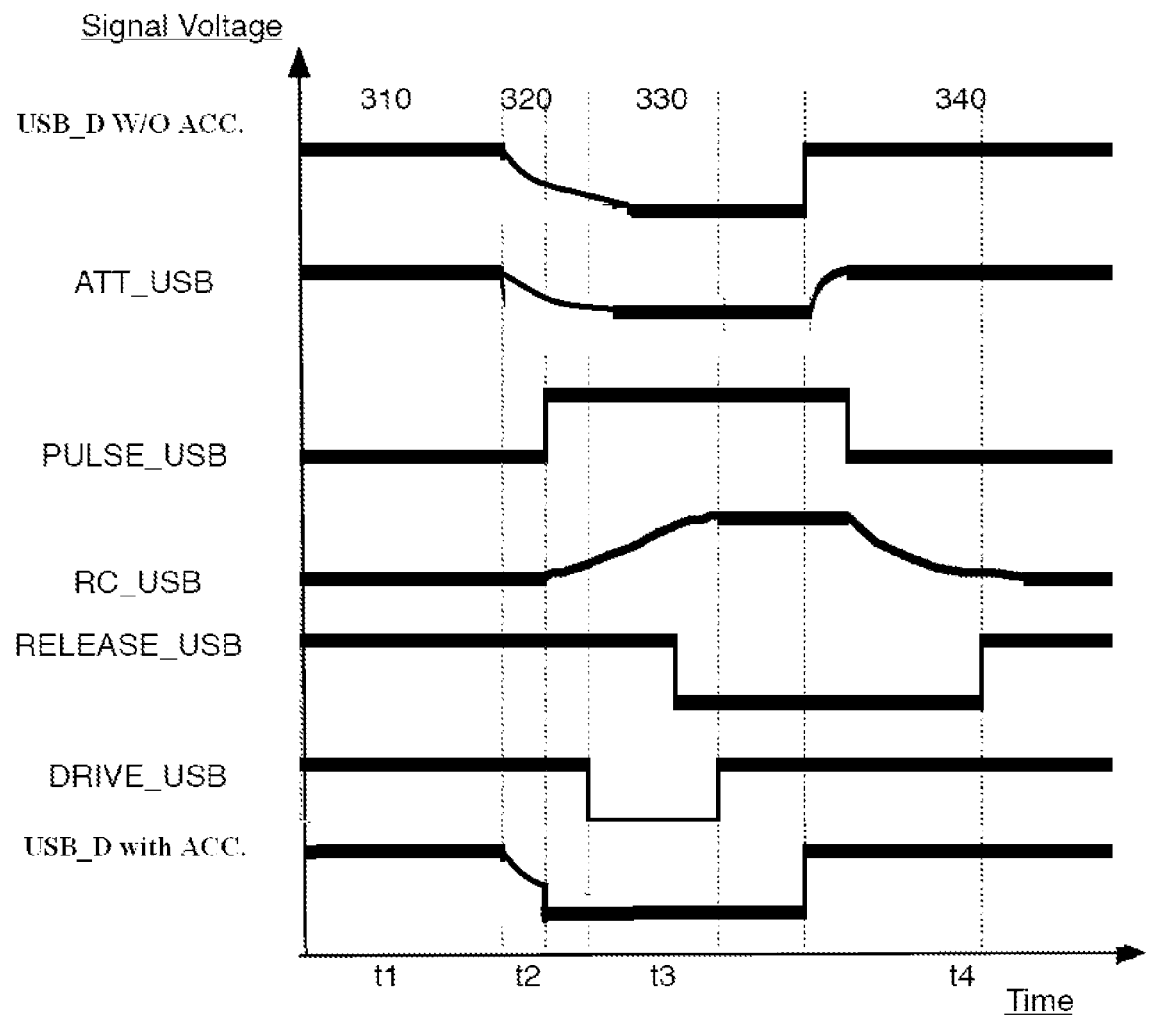
FIG. 3 is a general timing diagram of the fall time accelerator integrated circuit of FIG. 1B; and, FIG. 4 is a flow chart illustrating a process for fall time acceleration for USB interface in the computing system of FIG. 1B.

Consistent with the truth table, FIG. 3 is a general timing diagram of the fall time accelerator integrated circuit of FIG. 1B. As shown in FIG. 3, in stage 310 USB_D signal is in a high state and the fall time accelerator circuit awaits a falling edge. When a falling edge occurs, in stage 320 ATT_USB decays due to resistor R1 and gate delay U1. In stage 330, output gate U3 drives USB_D low for the period of time set by the active timer through the RC relationship of the RC modulator. Finally, in stage 340 a rising edge is detected on USB_D and the fall time accelerator circuit re-arms to await a next falling edge.

Figure 4:
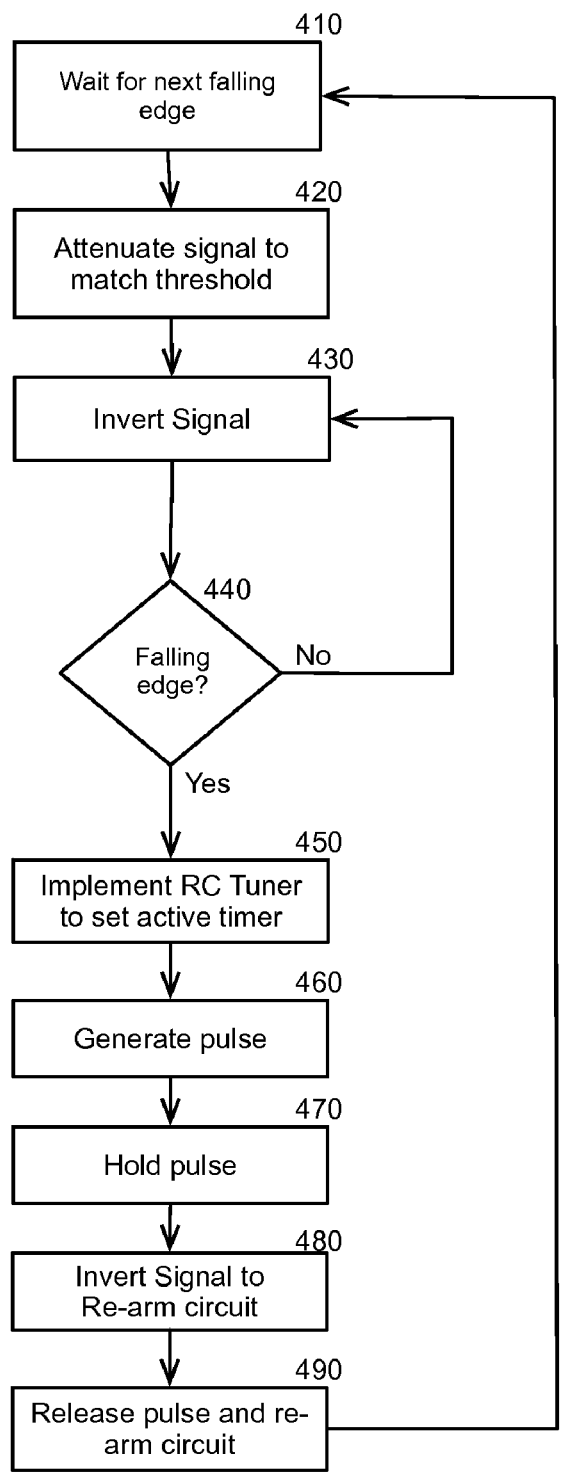

In yet further illustration, FIG. 4 is a flow chart illustrating a process for fall time acceleration for USB interface in the computing system of FIG. 1B. Beginning in block 410, the fall time accelerator circuit awaits a falling edge and remains in a high logic state. In block 420, an inbound USB signal can be attenuated to match the threshold of the fall time accelerator circuit. The attenuation can be fixed to any a specific percentage depending on the threshold level to activate the fall time accelerator circuit. For example, the activation threshold can range from 0 to 3.3 Volts. In block 430, after signal attenuation lowers the power of the signal and matches the threshold to the inverter, the signal can be inverted to activate the fall time accelerator circuit if the inbound signal falls below the threshold level.

In decision block 440, it can be determined if the inverted output is logic high. If so, a falling edge will have been detected and the fall time accelerator circuit becomes activated. Thereafter, in block 450, the fall time accelerator circuit can activate a timer to hold the signal low before releasing the bus back to the USB driver/receiver. In block 460, a constant high logic pulse can be generated and a slow charge can result for the given amount of time established by the timer. In block 470, this pulse is held for the given amount of time determined by the timer. Once the timer has lapsed, in block 480 the signal can be reverted in order to dis-arm/re-arm the fall time accelerator circuit. Finally, after the pulse is held for the given time period specified by the timer, the fall time accelerator circuit stops driving the signal low and releases the bus back to the USB driver/receiver.

We claim:

1. A fall time accelerator circuit comprising:
a pulse signal generator coupled to an inbound signal path from a universal serial bus (USB) and arranged to generate a tunable pulse upon detecting a falling edge of a digital signal on the inbound signal path;
an active timer additionally coupled to the inbound signal path to hold the tunable pulse for a set period of time; and
a falling drive signal strengthener coupled to an outbound signal path from the pulse signal generator arranged to release the tunable pulse on the outbound signal path onto the USB bus;
wherein the falling signal drive strengthener comprises a NAND gate with open-drain output driver.

2. The fall time accelerator circuit of claim 1, wherein the inbound signal path comprises an attenuator.

3. The fall time accelerator circuit of claim 1, further comprising a trigger arranged to detect the falling edge responsive to the digital signal crossing a pre-configured threshold.

4. The fall time accelerator circuit of claim 3, wherein the pre-configured threshold is set between 0 and 3.3 Volts.

5. The fall time accelerator circuit of claim 1, further comprising a resistor-capacitor (RC) modulator coupled to the active timer and arranged to provide the tunable pulse.

6. A universal serial bus (USB) interface comprising:
a USB port driver coupled to a host controller driver over a USB bus; and,
a fall time accelerator circuit coupled to the USB bus between the USB port driver and the host controller driver
wherein the fall time accelerator circuit comprises:
a pulse signal generator coupled to an inbound signal path from the USB bus and arranged to generate a tunable pulse upon detecting a falling edge of a digital signal on the inbound signal path;
an active timer additionally coupled to the inbound signal path to hold the tunable pulse for a set period of time; and
a falling drive signal strengthener coupled to an outbound signal path from the pulse signal generator arranged to release the tunable pulse on the outbound signal path onto the USB bus;
wherein the falling signal drive strengthener comprises a NAND gate with open-drain output driver.

7. The USB interface of claim 6, wherein the inbound signal path comprises an attenuator.

8. The USB interface of claim 6, further comprising a trigger arranged to detect the falling edge responsive to the digital signal crossing a pre-configured threshold.

9. The USB interface of claim 8, wherein the pre-configured threshold is set between 0 and 3.3 Volts.

10. The USB interface of claim 6, further comprising a resistor-capacitor (RC) modulator coupled to the active timer and arranged to provide the tunable pulse.

11. A fall time acceleration method comprising:
detecting a falling edge of a digital signal on an inbound signal path from a universal serial bus (USB) bus;
generating a tunable pulse upon detecting the falling edge of the digital signal on the inbound signal path;
holding the tunable pulse for a timed duration; and,
releasing the tunable pulse on an outbound signal path onto the USB bus.

12. The method of claim 11, further comprising attenuating the digital signal prior to detecting the falling edge.

13. The method of claim 11, wherein detecting a falling edge of a digital signal on an inbound signal path from the USB bus comprises:
measuring a voltage value of the falling edge;
determining when the voltage value falls below a pre-established threshold value; and,
triggering the generating of the tunable pulse in response to determining the voltage value to have fallen below the pre-established threshold value.

* * * * *